US009230966B2

(12) United States Patent
Sapra et al.

(10) Patent No.: US 9,230,966 B2
(45) Date of Patent: Jan. 5, 2016

(54) CAPACITOR AND METHOD OF MANUFACTURING THE SAME

(71) Applicant: NANYA TECHNOLOGY CORP., Tao-Yuan Hsien (TW)

(72) Inventors: Sanjeev Sapra, Boise, ID (US); Brett W. Busch, Boise, ID (US); Jian Li, Boise, ID (US); Chad Patrick Blessing, Boise, ID (US); Greg Allen Funston, Boise, ID (US)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/249,340

(22) Filed: Apr. 9, 2014

(65) Prior Publication Data

US 2015/0294971 A1 Oct. 15, 2015

(51) Int. Cl.
*H01L 21/00* (2006.01)
*H01L 27/108* (2006.01)
*H01L 49/02* (2006.01)
*H01L 21/02* (2006.01)

(52) U.S. Cl.
CPC .... *H01L 27/10805* (2013.01); *H01L 21/02046* (2013.01); *H01L 21/02052* (2013.01); *H01L 27/10861* (2013.01); *H01L 28/40* (2013.01)

(58) Field of Classification Search
CPC .................... H01L 27/0629; H01L 27/10894
See application file for complete search history.

(56) References Cited

U.S. PATENT DOCUMENTS

| | | | |
|---|---|---|---|
| 2002/0014649 A1* | 2/2002 | Kunikiyo | 257/306 |
| 2005/0164447 A1* | 7/2005 | Cheng | H01L 27/10864 438/246 |
| 2008/0026537 A1* | 1/2008 | Chung | H01L 27/10852 438/386 |
| 2009/0047769 A1* | 2/2009 | Bhat et al. | 438/387 |
| 2009/0206448 A1* | 8/2009 | Cho et al. | 257/532 |
| 2010/0240191 A1* | 9/2010 | Chung et al. | 438/386 |
| 2011/0241166 A1* | 10/2011 | Chumakov | 257/532 |
| 2013/0292796 A1* | 11/2013 | Cho et al. | 257/532 |

* cited by examiner

*Primary Examiner* — Zandra Smith
*Assistant Examiner* — Andre' C Stevenson
(74) *Attorney, Agent, or Firm* — Winston Hsu; Scott Margo

(57) ABSTRACT

A capacitor includes a substrate, a multilayer over the substrate, a plurality of container-shaped storage node structures on the semiconductor substrate and surrounded by the multilayer, the storage node structure has a sidewall extending upwardly from the base to the top, where the sidewall includes an upper segment and a lower segment thinner than the upper segment, a capacitor dielectric material along a surface of each storage node structure, and a capacitor electrode material over the capacitor dielectric material.

4 Claims, 10 Drawing Sheets

CAPACITOR AND METHOD OF MANUFACTURING THE SAME

BACKGROUND OF THE INVENTION

1. Field of the Invention

The present invention relates generally to a method of manufacturing semiconductor devices and, more specifically, to a method of manufacturing a capacitor with variable bottom cell plate (BCP) sidewall thickness.

2. Description of the Prior Art

Capacitors continue to have increasing aspect ratios in higher generation integrated circuitry fabrication. For example, dynamic random access memory (DRAM) capacitors now have elevations of from 1 to 3 microns, and widths of less than or equal to about 0.1 micron.

A common type of capacitor is a so-called container device. A storage electrode of such device is shaped as a container. Dielectric material and another capacitor electrode may be formed within the container and/or along an outer edge of the container, which can form a capacitor having high capacitance and a small footprint.

Container-shaped storage nodes are becoming increasingly taller and narrower (i.e., are being formed with higher aspect ratios) in an effort to achieve desired levels of capacitance while decreasing the amount of semiconductor real estate consumed by individual capacitors. Unfortunately, high aspect ratio container-shaped storage nodes can be structurally weak, and subject to toppling, twisting and/or breaking from an underlying base.

Exemplary methodology being developed to avoiding toppling of high aspect ratio containers is so-called lattice methodology. In such methodology, a lattice is provided to hold container-shaped electrodes from toppling, while leaving outer surfaces of the container-shaped electrodes exposed for utilization as capacitive surfaces of capacitors. During lattice methodology, container-shaped electrodes are formed in openings in a supporting material (such as, for example, borophosphosilicate glass (BPSG)), and then the supporting material is removed with an isotropic etch.

Unfortunately, conventional lattice methodology alone is not enough to prevent toppling, twisting and breaking of container-shaped storage nodes formed with increasingly high aspect ratios. Furthermore, in order to meet cell capacitance requirements for advanced DRAM technologies, larger and improved capacitance is always required. Accordingly, it is desired to develop new storage node structures, and new methods for forming storage node structures.

SUMMARY OF THE INVENTION

It is therefore one objective of the present invention to provide a novel capacitor structure with variable bottom cell plate (BCP) sidewall thickness to increase the capacitance as well as the dual lattice structures to increase the aspect ratio of the capacitor structure and further avoid the toppling issue. A method of manufacturing this capacitor structure without complicated process steps is also provided in the present invention to demonstrate the manufacture of the capacitor structure.

One object of the present invention is to provide a capacitor having a substrate; a multilayer over the substrate, wherein the multilayer includes an isolation layer on the substrate, a stack material layer on the isolation layer, an upper lattice layer on top of the stack material layer, and at least one lower lattice layer in the stack material layer; a plurality of container-shaped storage node structures on the semiconductor substrate and surrounded by the multilayer, the storage node structure having a base, a sidewall extending upwardly from the base to the top of the storage node structure, wherein the sidewall includes an upper segment and a lower segment thinner than the upper segment; a capacitor dielectric material along a surface of each storage node structure; and a capacitor electrode material over the capacitor dielectric material, with the capacitor electrode material being capacitively coupled to the storage node structure through the capacitor dielectric material.

Another object of the present invention is to provide a method of manufacturing a capacitor, which include the steps of providing a substrate with a multilayer formed thereon, wherein the multilayer includes an isolation layer on the substrate, a stack material layer on the isolation layer, an upper lattice layer on the stack material layer, and at least one lower lattice layer in the stack material layer; forming a recess in the multilayer; conformally forming a storage layer on the surface of the multilayer and the recess; filling up the recess with a photoresist; removing the storage layer on the upper lattice layer; partially removing the photoresist in said recess and exposing a portion of the storage layer; laterally thinning the exposed storage layer above the photoresist; removing the photoresist; forming a capacitor dielectric material along the surface of the storage layer; and forming a capacitor electrode material over the capacitor dielectric material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
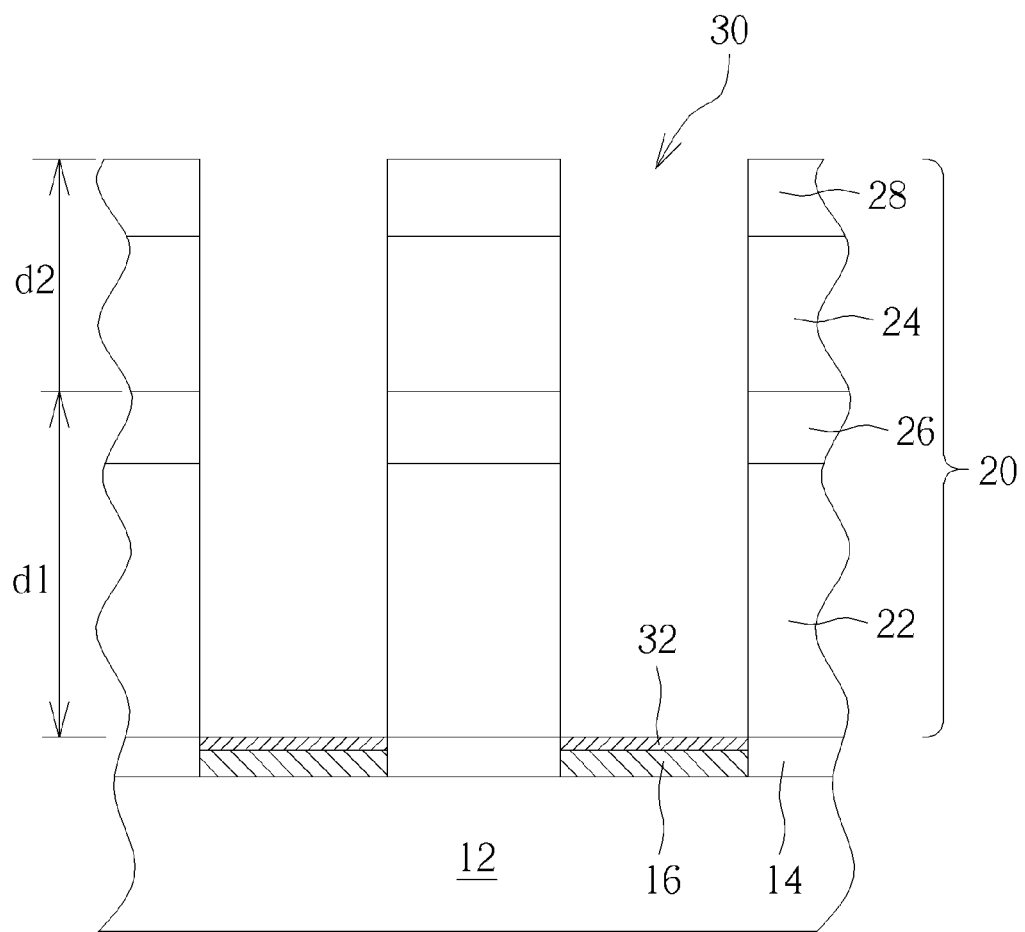
FIGS. 1-7 are cross-sectional views schematically depicting a process flow for manufacturing a single-sided capacitor structure in accordance with one embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Please refer to FIGS. 1-7, which are cross-sectional views schematically depicting a process flow for manufacturing a capacitor in accordance with one embodiment of the present invention. First, as shown in FIG. 1, a semiconductor substrate 12 is provided to serve as a base for forming devices, components, or circuits. The substrate 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material regions (either alone or in assemblies comprising other materials). The term "substrate" refers to any supporting structure, including, but not limited to, the semiconductive substrates described above. Although the substrate 12 in this embodiment is shown to be homogenous, the substrate may comprise numerous materials in some embodiments. For instance, the substrate 12 may correspond to a semiconductor substrate containing one or more materials associated with integrated circuit fabrication. In such embodiments, such materials may correspond to one or more of refractory metal materials, barrier materials, diffusion materials, insulator materials, etc.

Refer again to FIG. 1, isolation layers 14 are formed over the substrate 12 with source/drain implant regions 16 are shown to be between the isolation layers 14. The isolation layers 14 may correspond to shallow trench isolation regions in the substrate 12, and may be filled with any suitable electrically insulative composition or combination of electrically insulative compositions. For instance, in some embodiments the isolation layers 16 may be filled with one or more of silicon dioxide, silicon nitride and silicon oxynitride. The source/drain implant region 16 may comprise any suitable dopant or combination of dopants, and in some embodiments may correspond to an n-type doped region of semiconductor material of substrate 12. For instance, the substrate 12 may comprise monocrystalline silicon, and source/drain implant region 16 may correspond to a region of the substrate 12 that is conductively doped with one or both of phosphorus and arsenic. Alternatively, the source/drain implant region 16 may be formed of metal such as tungsten (W) or layers such as TiN/W. The source/drain implant region 16 is one example of an electrical node that may be electrically connected with the base of a storage node. Detailed description will be provided in the following embodiment.

A multilayer 20 is formed over the substrate 12 and covers the isolation layers 14 and the implant region 16. The multilayer 20 includes a lower stack material layer 22 and an upper stack material layer 24 on the isolation layers 16 and the implant region 16 with a lower lattice layer 26 sandwiched therebetween. An upper lattice layer 28 is formed on the top surface of the upper stack material layer 24. The height of the sum of the lower stack material layer 22 and the lower lattice layer 26 is about 8000 Å ($d_1$), the height of the sum of the upper stack material layer 24 and the upper lattice layer 28 is about 7000 Å ($d_2$), and the total stack height of the multilayer 20 may be about range of 15000 Å to 20000 Å.

The stack material layers 22 and 24 may be a sacrificial layer made of any suitable composition or combination of compositions; and in some embodiments may comprise one or more of silicate glass (for instance, borophosphosilicate glass, phosphosilicate glass, fluorosilicate glass, etc.), spin-on-dielectric, and silicon dioxide formed from tetraethyl orthosilicate (TEOS), or may be a semiconductive layer such as amorphous silicon or polysilicon. The lattice layer 26 and 28 may be made of any suitable composition or combination of compositions, such as silicon nitride ($Si_3N_4$). Please note that in this embodiment, only a lower lattice layer 26 is provided in the stack material layer. In other embodiment, there may be two or more lower lattice layers disposed in the stack material layer.

Refer again to FIG. 1, a plurality of recesses 30 are formed in the multilayer 20 for accommodating the storage node structure to be manufactured. The recess 30 extends through the entire thickness of the multilayer 30 and exposes the source/drain implant region 16 thereunder. In the shown embodiment, the source/drain implant region 16 is configured to be electrically connected with the storage node. Thus, an electrically conductive layer 32 is required to be pre-formed over the implant region 16 to improve electrical coupling between the base of storage node and the conductively-doped implant region 16. For instance, the conductive layer 32 may be a metal silicide (e.g., titanium silicide, tungsten silicide, etc.) layer formed by silicide process. Alternatively, if the source/drain implant region 16 is formed of metal (ex. W) or metal layers (ex. TiN/W), the electrically conductive layer 32 may be omitted.

In the present invention, the design of dual (or multiple) lattice layers may improve the conventional lattice methodology and provide enough support to prevent the capacitor electrodes from toppling. Furthermore, better aspect ratio of the capacitor recess may be obtained to further increase the capacitance in this kind of multi-lattices stack structure.

Figure 2:
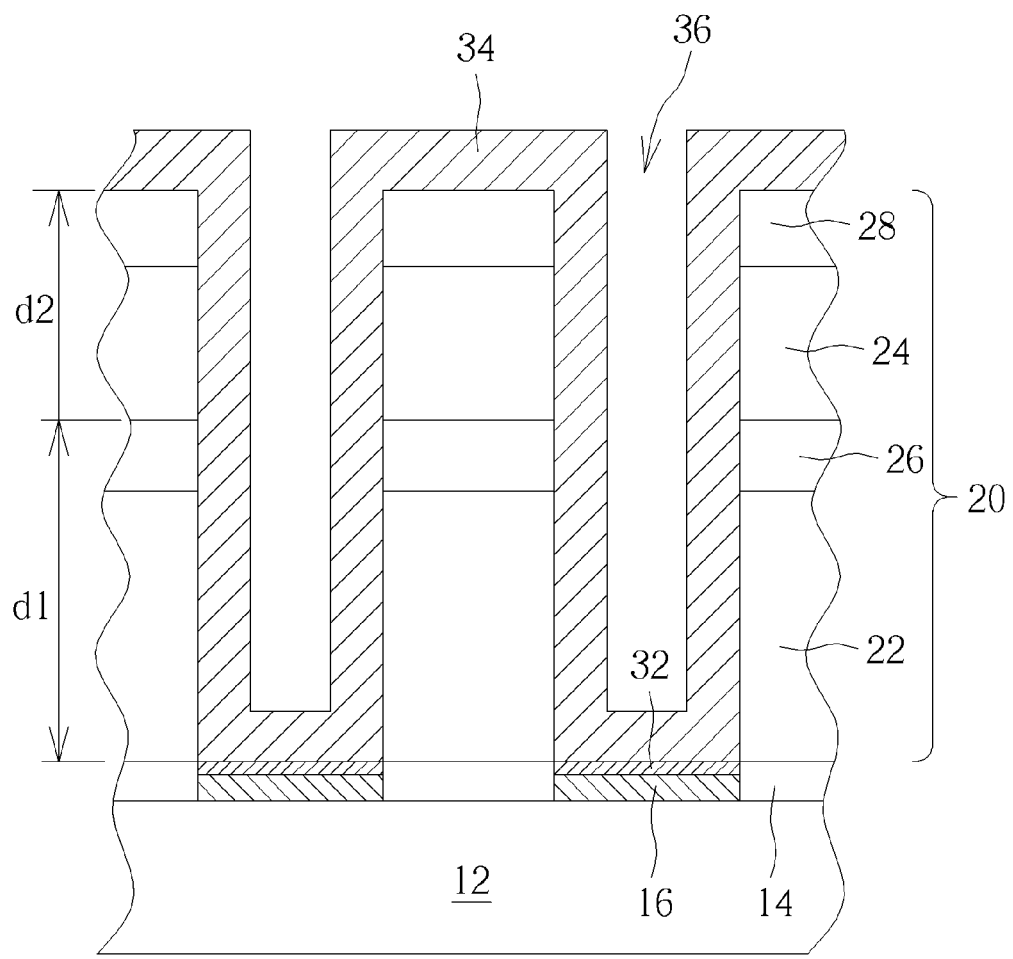

As shown in FIG. 2, after providing the multilayer 20 and the recesses 30, a storage layer 34 is conformally formed on the surface of the multilayer 20 and the recesses 30. A smaller recess 36 is defined in each former recess 30. In this embodiment, the storage layer 34 will be used to form the storage node structure with variable thickness. The storage layer 34 may be made of any suitable electrically conductive composition or combination of compositions, such as titanium nitride (TiN).

Figure 3:
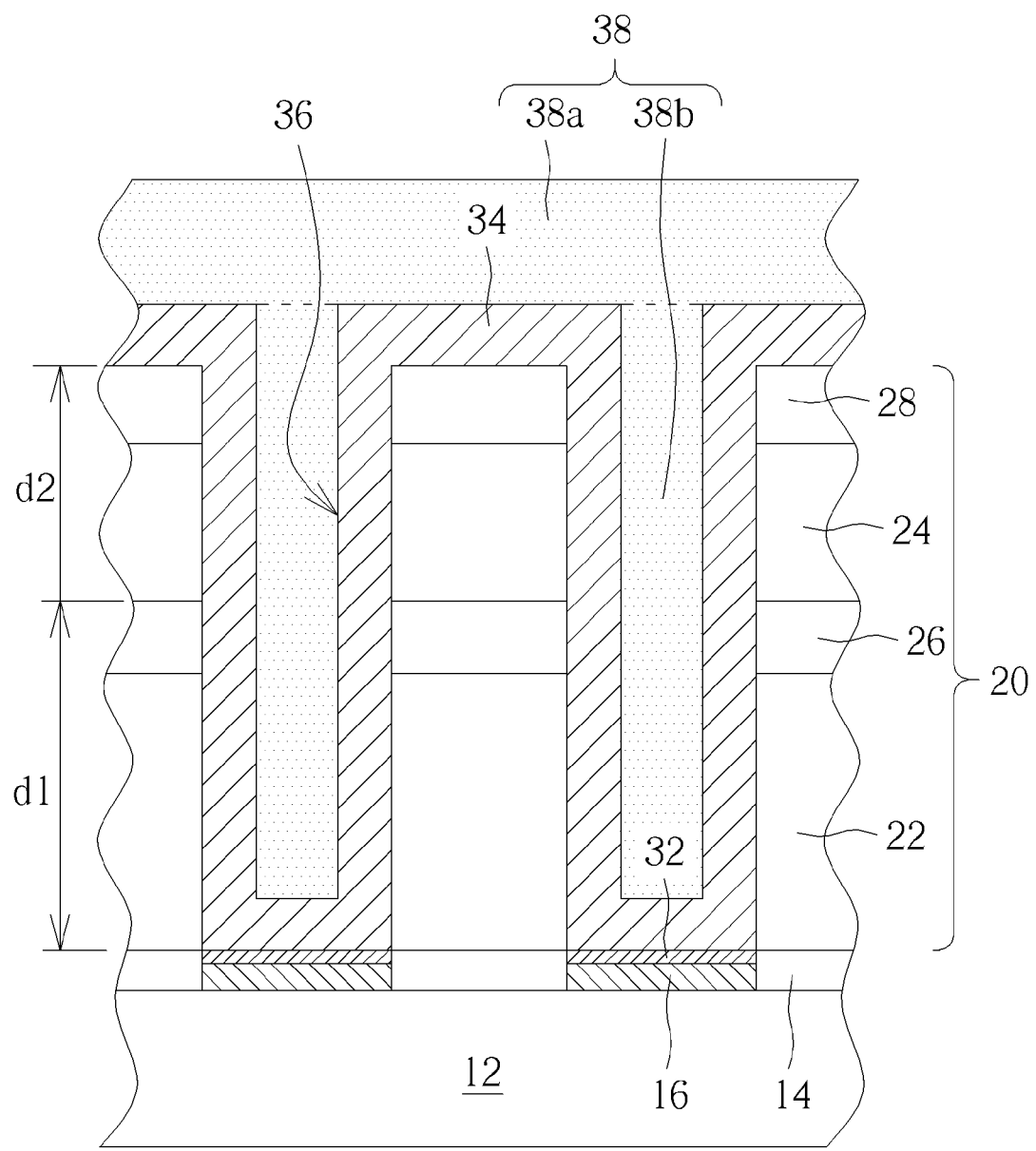

As shown in FIG. 3, after forming the storage layer 34, a photoresist 38 is formed on the multilayer 20. In this embodiment, the photoresist 38 includes an outer portion 38a covering the entire multilayer 20 and an inner portion 38b filling up the recess 36. The inner portion 38b of the photoresist 38 may prevent the slurry particle or residue being entrapped in the recesses 36 in the following planarization process. Please note that the photoresist 38 may be replaced with other material such as oxide (ex. spin-on dielectric, SOD).

Figure 4:
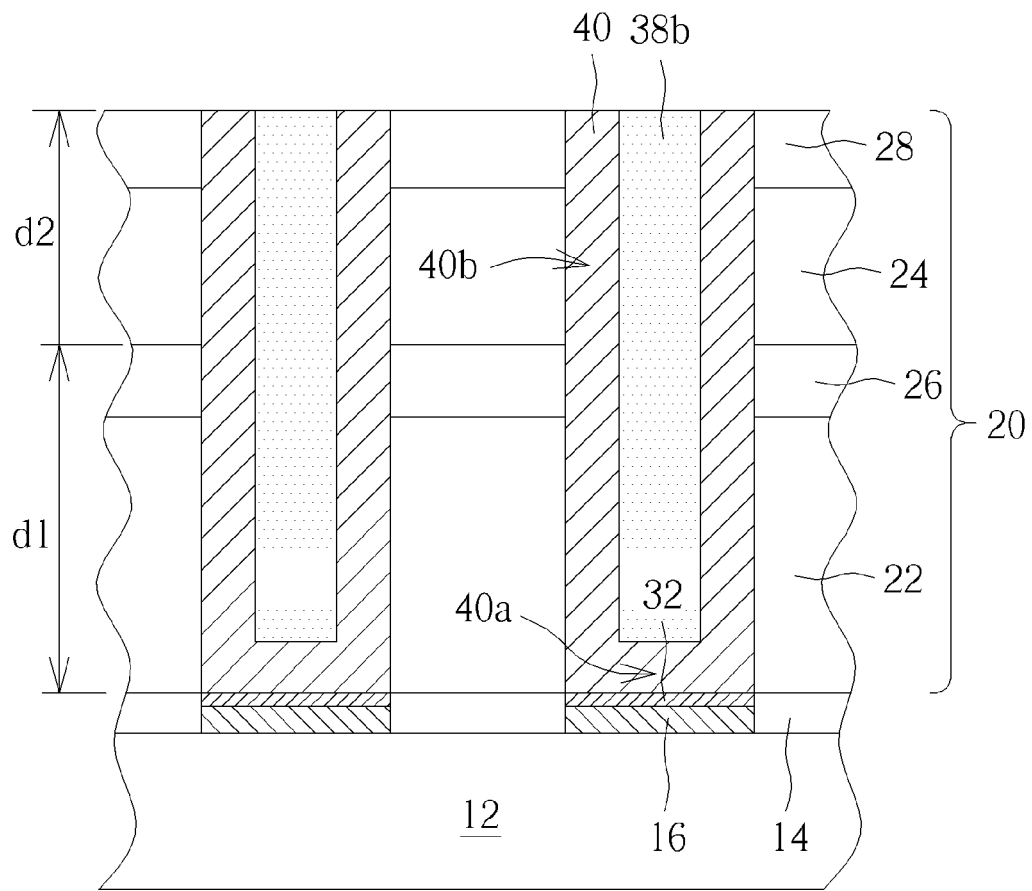

As shown in FIG. 4, after covering and filling with the photoresist 38, a chemical mechanical polishing (CMP) process is performed to remove the outer portion 38a of the photoresist 38 and a portion of the storage layer 34 on the upper lattice layer 28, thus the storage layer 34 may be transformed to a container-shaped storage node structure 40 embedded in the multilayer 20. The storage node structure 40 includes a base 40a along the bottom which is electrically connected with the source/drain implant region 16 (through the silicide 32) thereunder, and two sidewalls 40b extending upwardly from the base 40a. The top surface of the storage node structure 40 is coplanar with the top surface of the upper lattice layer 28. Although there appear to be two separate sidewalls 40b along the cross-section of the view of FIG. 4, such sidewalls 40b may be a part of a single sidewall structure when considered in three dimensions, such as a single circular cylinder when viewed from above.

The sidewalls 40b in the cross-sectional view of FIG. 4 have a substantially constant thickness from the bottoms of the sidewalls to the tops of the sidewalls. The term "substantially constant thickness" means that the thickness is uniform to within tolerances imposed by the fabrication process utilized to form the storage node structure 40. In some embodiments, the thickness of the sidewalls 40b of the storage node structure 40 may be within a range of from about 40 Å to about 100 Å, and may be, for example, about 70 Å. In some embodiments, the thickness may vary from the top of the sidewalls to the bottom of the sidewalls, with the upper portion of the sidewall being thicker than the lower portion of the sidewall due to difficulties associated with the uniform deposition of the storage layer 34 within a high aspect ratio opening during formation of the storage node structure 40.

In the shown embodiment, source/drain implant region 16 is electrically connected to the storage node structure 40. In some embodiments, the storage node structure 40 is ultimately incorporated into a capacitor, and such capacitor is ultimately connected to a transistor to form a DRAM unit cell. Thus, implant region 16 may connect to a transistor gate that gatedly couples source/drain implant region 16 to another source/drain implant region (not shown). The transistor gate may be part of an access line (i.e., a word line), and the other source/drain region may be connected to a digit line. Accordingly, the storage node structure 40 may be uniquely addressed through the combination of the digit line and the access line. The shown storage node structure 40 may be one of a large plurality of storage node structures that are subjected to identical processing during fabrication of a DRAM array.

Figure 5:
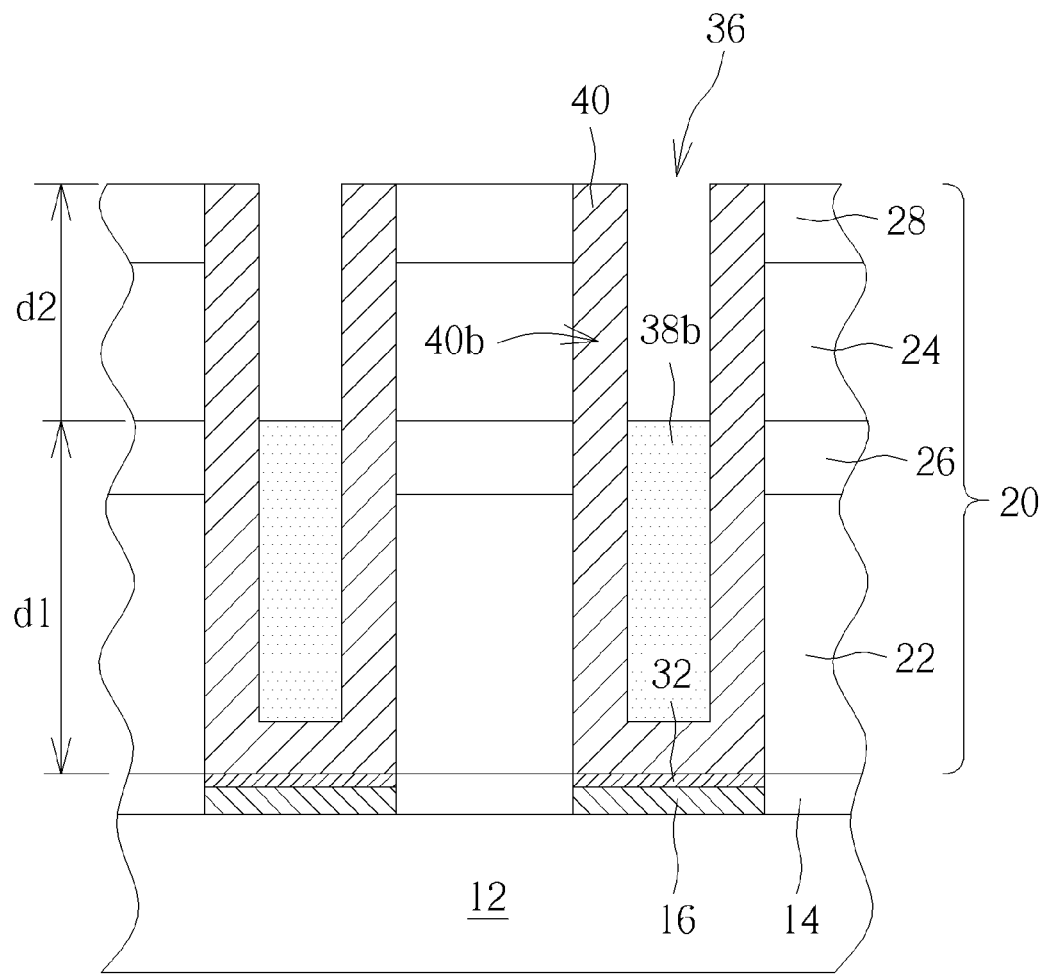

As shown in FIG. 5, after the CMP process, a descum process is performed to partially removed the inner portion 38b from the recess 36. The descum process may be optimized to control the inner portion 38b recessing inside the container-shaped storage node structure 40. In this embodiment, the inner portion 38b is partially removed such that the sidewall 40b of the storage node structure 40 above the lower lattice layer 26 is exposed and may be subject to a following thinning process. Detailed description will be provided in the following embodiment.

Figure 6:
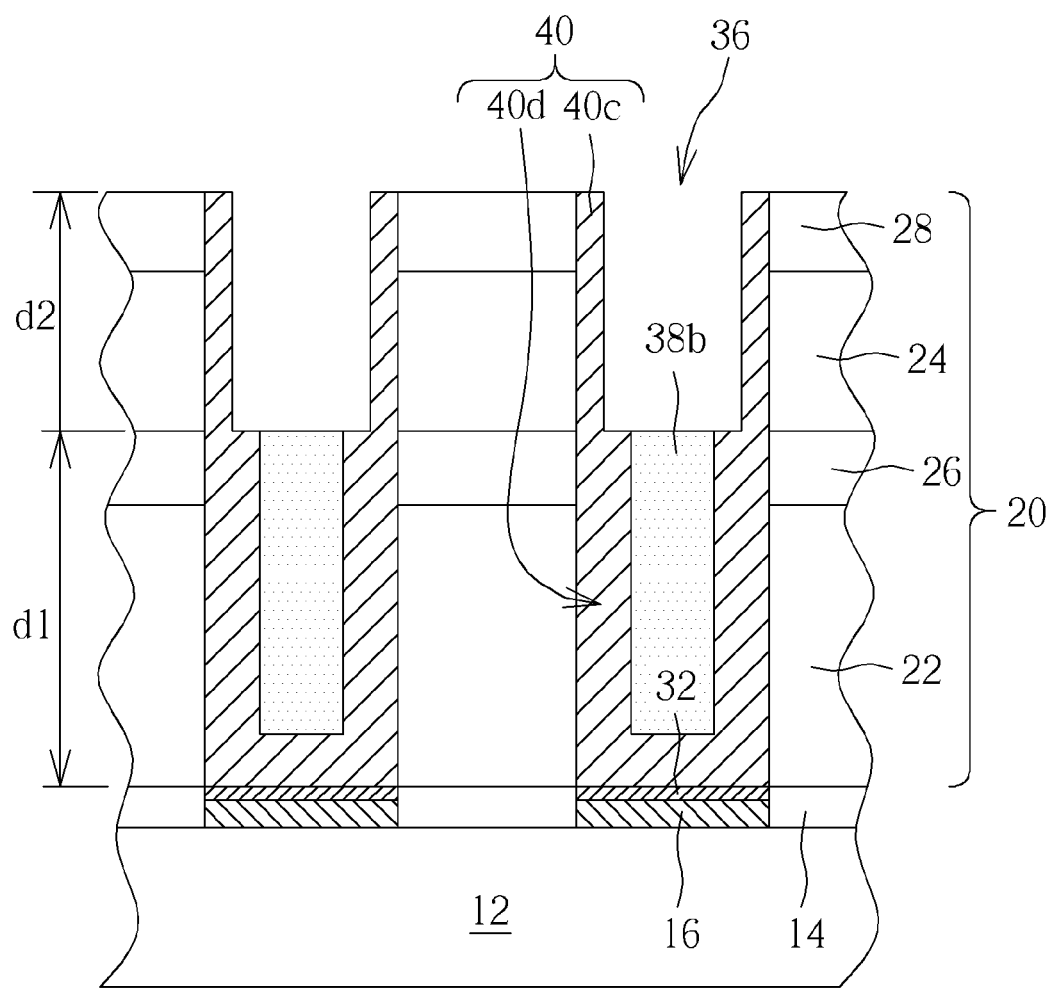

As shown in FIG. 6, after a portion of sidewall 40b of the storage node structure 40 is exposed, a post-descum wet clean process is performed to laterally etch and thin the exposed storage node structure 40 above the inner portion 38b, while the unexposed storage node structure 40 protected by the inner portion 38b is intact. After the thinning process, the sidewall 40b of the storage node structure 40 may be divided into two distinct segments, wherein one is the upper segment 40c with small thickness, the other is the lower segment 40d with larger thickness. The boundary of the upper segment 40c and the lower segment 40d may be above or below the lattice layer 26 depending on the cap requirement. The wet clean process may use chemical with HF concentration ranging from 2000:1 HF to 10:1 HF followed by a standard APM clean process with APM concentration ranging from 0.5:1.0 APM to 0.02:0.025 APM. An etch process may be considered to be "selective" for a first material relative to a second material if the etch removes the first material at a faster rate than the second material, which can include but is not limited to, etches which are 100% selective for the first material relative to the second material. It may be desirable to utilize an etchant that removes the storage node structure 40 relatively slowly in order to have stringent control over the removing amount removed during the thinning process. Accordingly, it may be desirable to have the active components of the etchant be relatively dilute in the etchant and/or to utilize relatively cold etchant, such as cold APM.

In this embodiment, the reduced thickness of the upper segment 40c of the storage node structure 40 may be less than or equal to one-half of the original thickness of the lower segment 40d. For instance, the thickness of the lower segment 40d may be 40 Å, while the reduced thickness of the upper segment 40c may be thinned to 20 Å.

Figure 7:
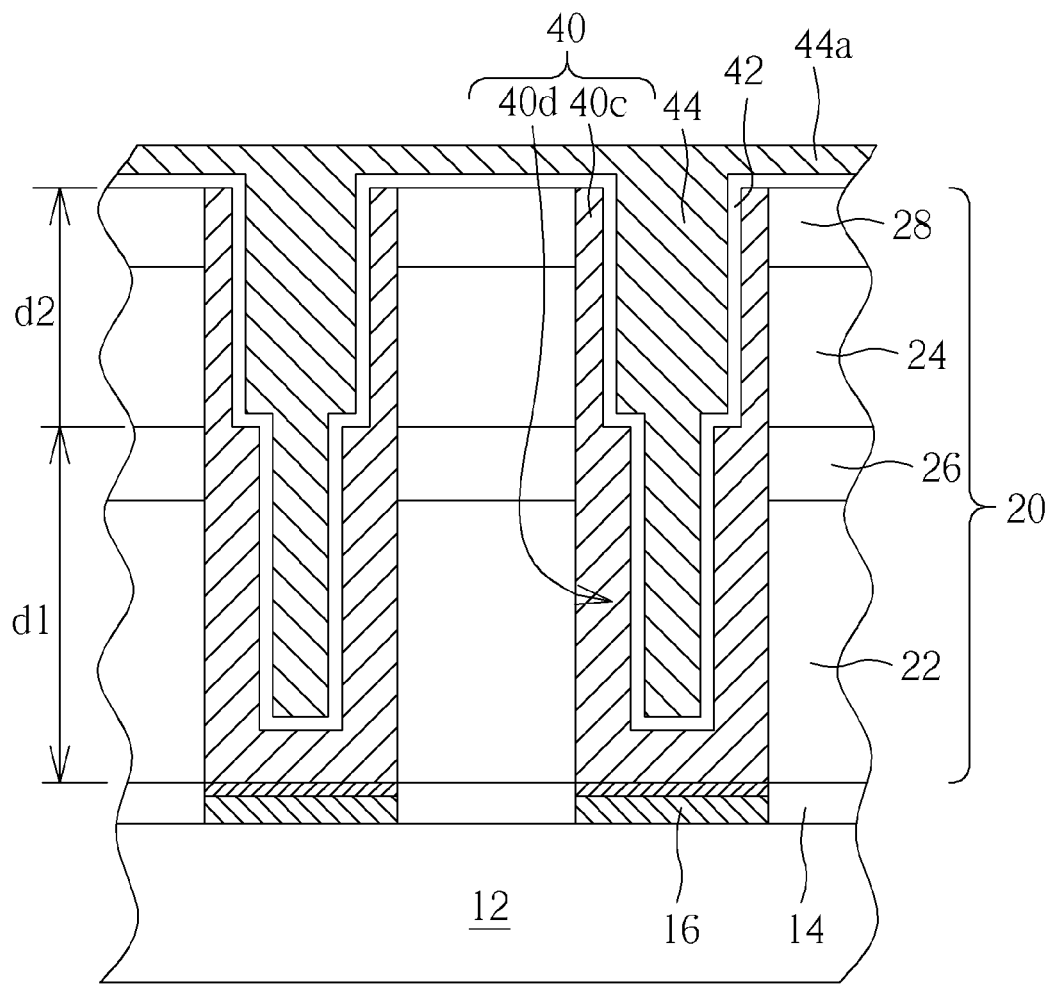

As shown in FIG. 7, after thinning the storage node structure 40, the remaining inner portion 38b in the storage node structure 40 may be completely removed to expose the whole recess. A capacitor dielectric material 42 is formed conformally along the inner surfaces of the modified storage node structure 40 and the surface of the upper lattice layer 28, including the upper segment 40c and lower segment 40d, and subsequently a capacitor electrode material 44 (which may also be referred to as cell plate material) is formed along the capacitor dielectric material 42. The capacitor electrode material 44 fills up the recess formed in the upper segment 40c and the lower segment 40d of the modified storage node structure 40 and covers the entire surface of the upper lattice layer 28. The portion 44a of capacitor electrode material 44 on the upper lattice layer 28 may serve as a top electrode of the capacitor. The capacitor electrode material 44 is capacitively connected to the modified storage node structure 40 through the capacitor dielectric material 42. In this embodiment, the capacitor dielectric material 42 may comprise any suitable composition or combination of compositions, such as one or both of silicon nitride and silicon dioxide. The capacitor electrode material 44 may comprise any suitable composition or combination of compositions, such as one or more of various metals (for instance, titanium, tungsten, etc.), metal-containing compositions (for instance, metal nitride, metal silicide, etc.) and conductively-doped semiconductor materials (for instance, conductively-doped silicon, conductively-doped germanium, etc.). The capacitor dielectric material and capacitor electrode material may be formed utilizing any suitable methods, including, for example, one or more of atomic layer deposition (ALD), chemical vapor deposition (CVD), and physical vapor deposition (PVD).

The embodiment of FIG. 7 shows modified (partially thinned) storage node structure 40 incorporated into a capacitor comprising such storage node in combination with capacitor dielectric material 42 and capacitor electrode material 44. The capacitor may be utilized in combination with a transistor (which may correspond to the circuit in the substrate 12) to form a DRAM unit cell, and such unit cell may be representative of a large number of unit cells simultaneously formed and incorporated into a DRAM array. Additionally, a CMP process may be performed to remove the portion 44a of capacitor electrode material 44 on the upper lattice layer 28 if the top electrode is unnecessary.

Figure 8:
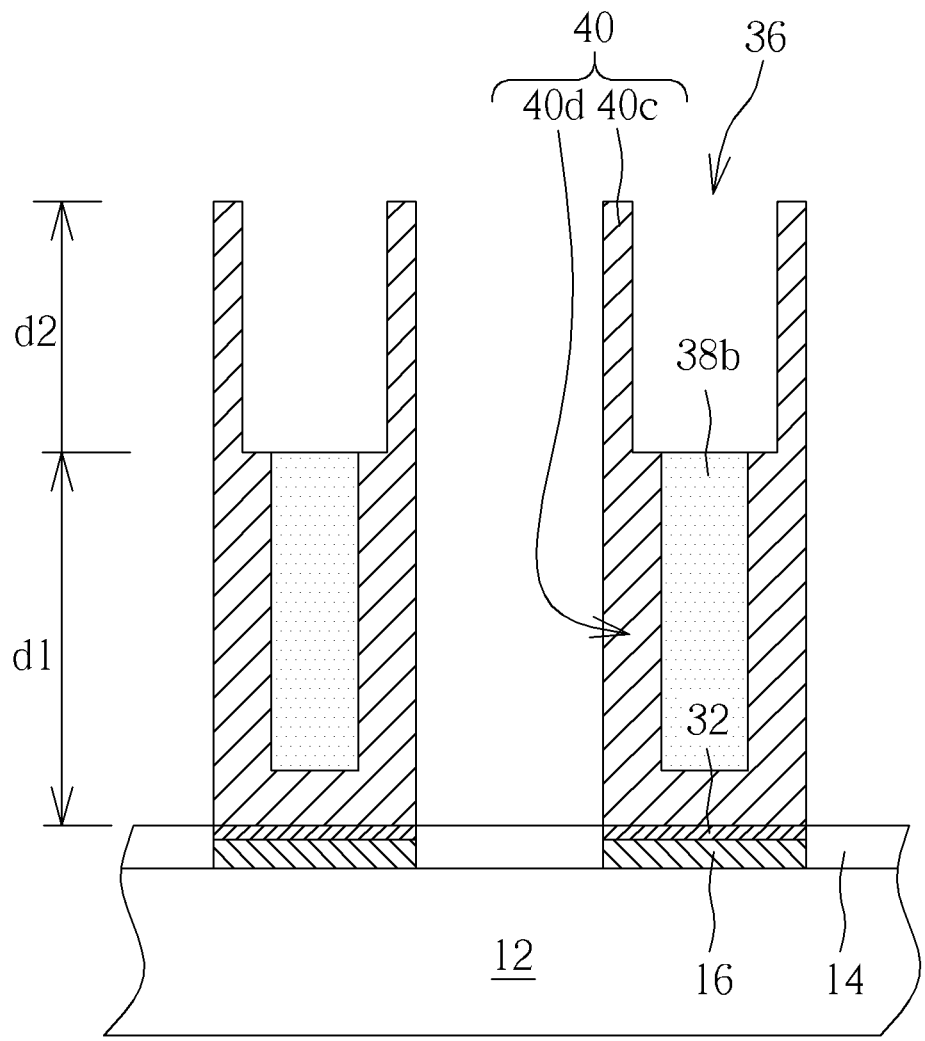
FIGS. 8-10 are cross-sectional views schematically depicting a process flow for manufacturing a double-sided capacitor structure in accordance with another embodiment of present invention.
Figure 9:
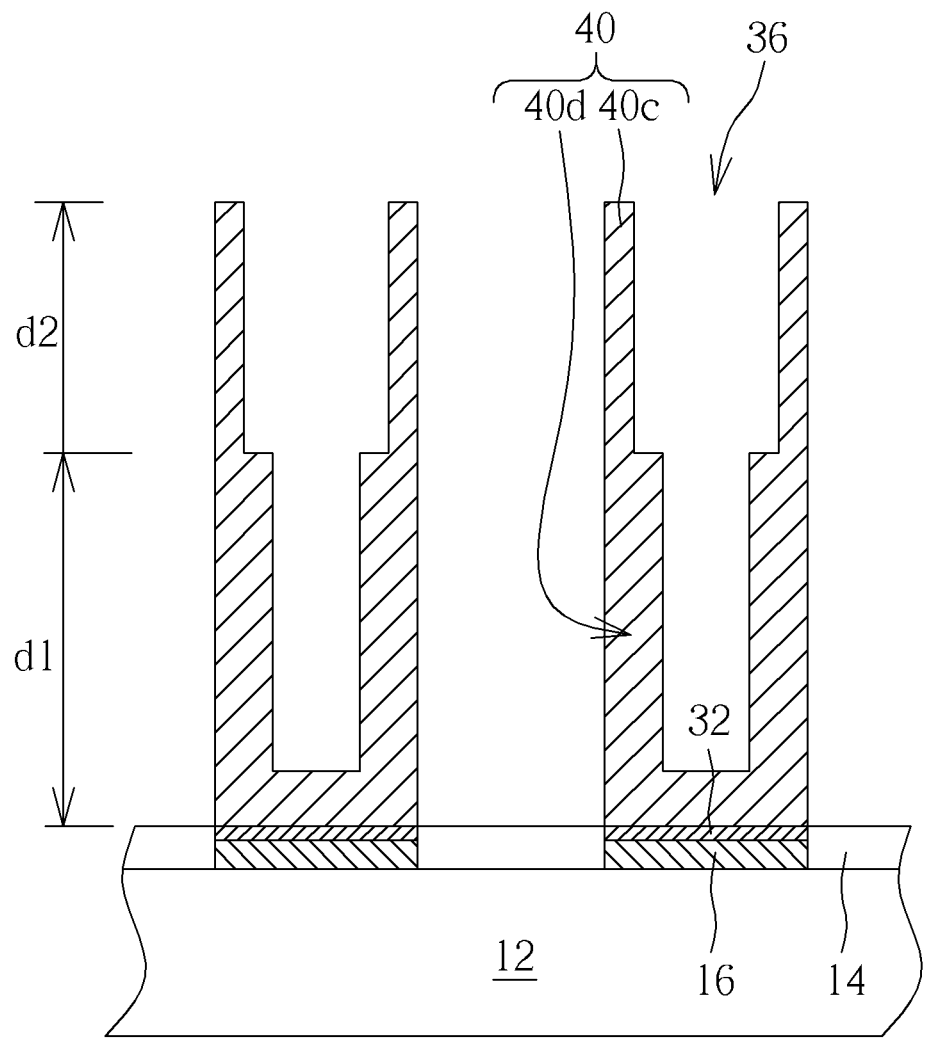
Figure 10:
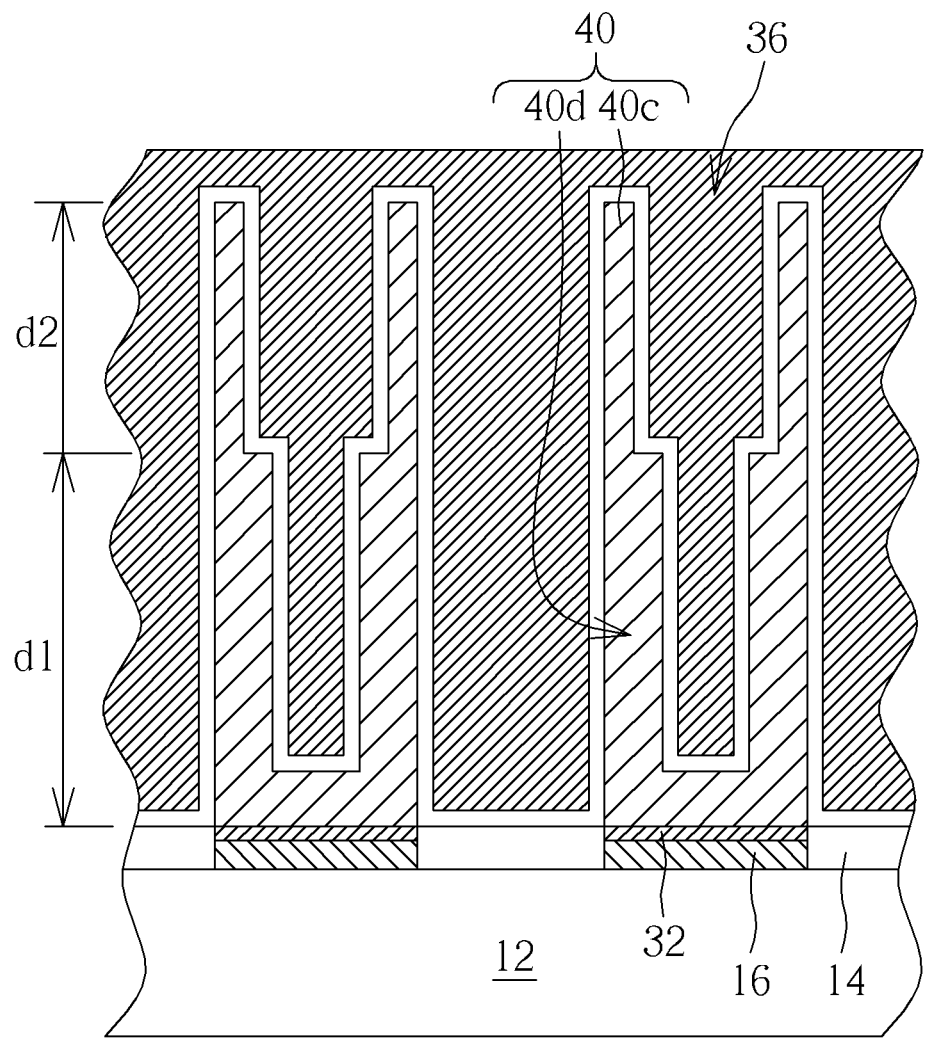

Please note that the capacitor structure shown in FIG. 7 is single-sided. In other embodiment, it may also be double-sided design. Please refer to FIGS. 8-10, which are cross-sectional views schematically depicting a process flow for manufacturing a double-sided capacitor structure in accordance with another embodiment of present invention. First, as shown in FIG. 8, before removing the inner portion 38b of the photoresist, a wet etching process may be performed to remove the multilayer 20 around the modified storage node structure 40. As shown in FIG. 9, the remaining inner portion 38b in the storage node structure 40 may be completely removed to expose the whole recess after the multilayer 20 is removed, thus both sidewalls of the storage node structure 40 are exposed.

Subsequently, similar to the process shown in FIG. 7, a capacitor dielectric material 42 is conformally formed along the inner and outer surfaces of the modified storage node structure 40, including the upper segment 40c and lower segment 40d, and subsequently a capacitor electrode material 44 (which may also be referred to as cell plate material) is formed along the capacitor dielectric material 42. The capacitor electrode material 44 fills up the recesses formed in and between the modified storage node structures 40 and covers the entire surface of the upper lattice layer 28. The capacitor electrode material 44 is capacitively connected to the modified storage node structure 40 through the capacitor dielectric material 42 from both sidewalls of protruding upper and lower segment 40c and 40d, thus double-sided capacitor structures are formed.

According to the above-mentioned method, a novel capacitor structure is also provided in the present invention. As shown in FIG. 7, the capacitor structure comprises a substrate 12; a multilayer 20 over the substrate 12, wherein the multilayer 20 includes an isolation layer 14 on the substrate 12, at least one stack material layer 22/24 on the isolation layer 14, an upper lattice layer 28 on top of the stack material layer 24, and at least one lower lattice layer 26 in the stack material layer 22/24; a plurality of container-shaped storage node structures 40 on the semiconductor substrate 12 and surrounded by the multilayer 20, the storage node structure 40 having a base, a sidewall extending upwardly from the base to the top of the storage node structure, wherein the sidewall includes an upper segment 40c and a lower segment 40d thinner than the upper segment 40c; a capacitor dielectric material 42 along a surface of each storage node structure 40; and a capacitor electrode material 44 over the capacitor dielectric material 42, with the capacitor electrode material being capacitively coupled to the storage node structure through the capacitor dielectric material.

One essential feature of the present invention is that the storage node structure has a variable thickness. The scheme of variable thickness may increase the effective capacitor area and capacitance of the storage node structure without compromising the margin for the toppling issue. Furthermore, the design of dual or multiple lattice layers may provide enough support to prevent the capacitor electrodes from toppling issue and obtain better aspect ratio for the embedded type capacitor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a capacitor, comprising the steps of:
    providing a substrate with a multilayer formed thereon, wherein said multilayer comprises an isolation layer on said substrate, a stack material layer on said isolation layer, an upper lattice layer on said stack material layer, and at least one lower lattice layer in said stack material layer;
    forming a recess in said multilayer;
    conformally forming a storage layer on the surface of said multilayer and said recess;
    filling up said recess with a photoresist;
    removing said storage layer on said upper lattice layer;
    partially removing said photoresist in said recess and exposing a portion of said storage layer;
    laterally thinning said exposed storage layer above said photoresist;
    removing said photoresist;
    forming a capacitor dielectric material along the surface of said storage layer; and
    forming a capacitor electrode material over said capacitor dielectric material.

2. The method of manufacturing a capacitor according to claim 1, wherein said storage layer is removed by a chemical mechanical process.

3. The method of manufacturing a capacitor according to claim 1, wherein said photoresist is partially removed by a descum process.

4. The method of manufacturing a capacitor according to claim 1, wherein said exposed storage layer is laterally thinned by a wet clean process.

* * * * *